United States Patent [19]

Mark

[11] Patent Number: 5,303,139
[45] Date of Patent: Apr. 12, 1994

[54] LOW FREQUENCY, PULSED, BIPOLAR POWER SUPPLY FOR A PLASMA CHAMBER

[75] Inventor: Gunter Mark, Ottersweier, Fed. Rep. of Germany

[73] Assignee: Magtron Magneto Elektronische Gerate GmbH, Ottersweier, Fed. Rep. of Germany

[21] Appl. No.: 922,159

[22] Filed: Jul. 30, 1992

[30] Foreign Application Priority Data

Jul. 31, 1991 [DE] Fed. Rep. of Germany ....... 9109503

[51] Int. Cl.$^5$ .............................................. H02M 7/42
[52] U.S. Cl. .................................. 363/63; 204/298.08; 315/111.21; 363/98
[58] Field of Search .............. 313/231.31; 315/111.21; 363/63; 373/18; 219/76.16, 121.43, 121.54; 204/298.08; H02M 7/458

[56] References Cited

U.S. PATENT DOCUMENTS

| | | | |
|---|---|---|---|
| 4,454,573 | 6/1984 | Petsch et al. | 363/98 |
| 4,719,558 | 1/1988 | Hanada et al. | 363/98 |
| 4,724,296 | 2/1988 | Morley | 219/121 |
| 4,780,803 | 10/1988 | Garcia-Santamaria | 363/98 |
| 5,130,003 | 7/1992 | Conrad | 204/176 |

*Primary Examiner*—William H. Beha, Jr.
*Attorney, Agent, or Firm*—Collard & Roe

[57] ABSTRACT

The invention relates to a bi-polar power supply for a plasma chamber including an adjustable DC power supply having a positive output terminal and a negative output terminal. A transistor bridge circuit having two input bridge terminals is coupled to the positive and negative output terminals. Two bridge output terminals of the transistor bridge are coupled to the plasma chamber. A current detector is coupled to the two bridge output terminals for detecting the current flowing to the plasma chamber and controlling the transistor bridge circuit to provide a bi-polar power supply to the plasma chamber.

8 Claims, 7 Drawing Sheets

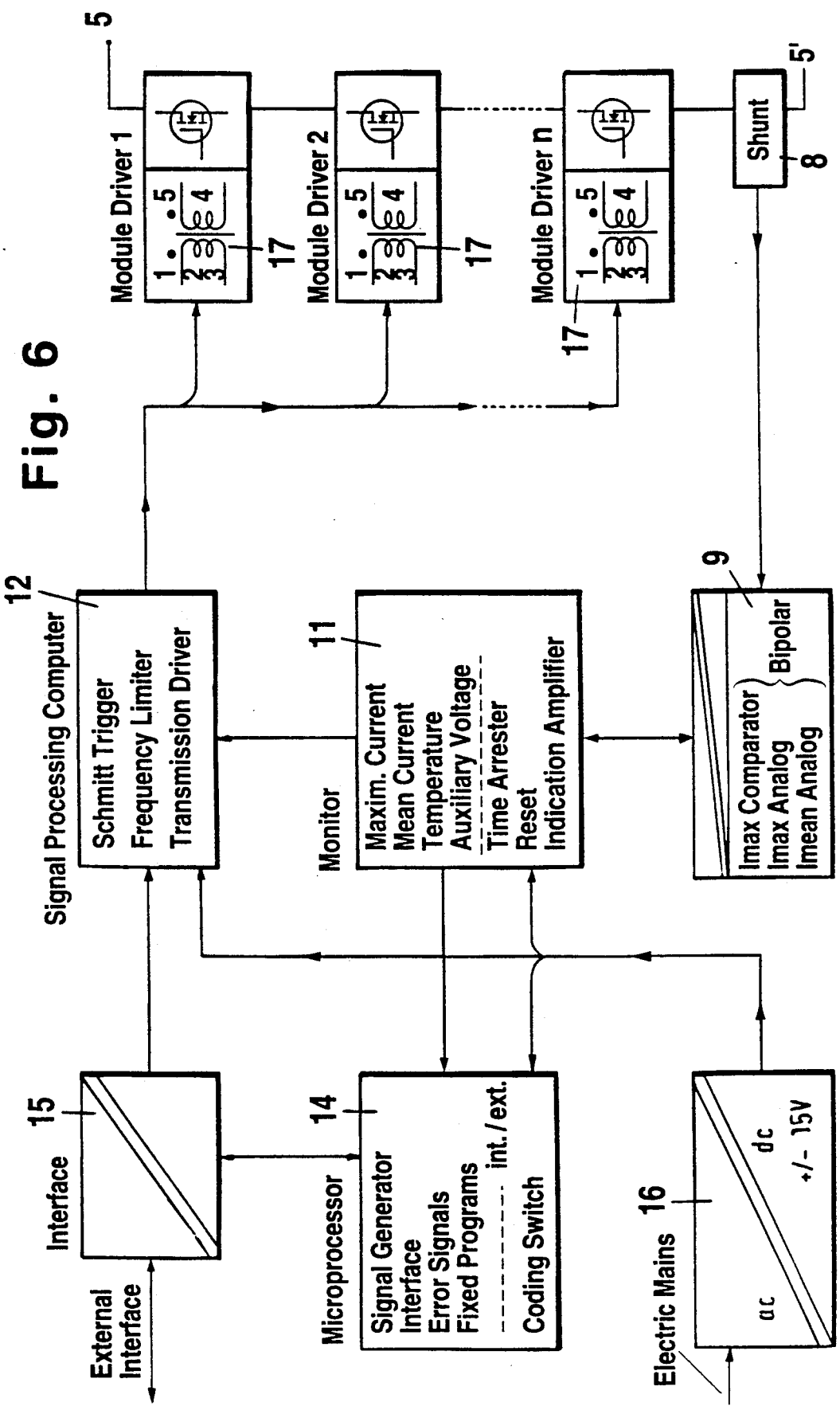

LOW FREQUENCY, PULSED, BIPOLAR POWER SUPPLY FOR A PLASMA CHAMBER

BACKGROUND OF THE INVENTION

1. Field of the Invention

The present invention relates to a power supply for a plasma chamber. More specifically, it relates to a bipolar power supply having a MOSFET bridge circuit and a current detector to control the MOSFET bridge circuit.

2. The Prior Art

In plasma technology, technical processes are known which have electric gas discharges in a vessel. These dry discharges are capable of changing, activating or coating a surface without contacting the workpiece. In such processes, the desired effects are brought about physically with physical vapor deposition (PVD) or, for example, chemically with chemical vapor deposition (CVD).

The electric discharges for producing the plasma are created by high-frequency generators. These high-frequency (HF) generators may operate, for example, at a frequency of 13.65 Mhz, which is costly in high-energy applications. In addition, extensive safety requirements are necessary for the operators.

SUMMARY OF THE INVENTION

It is therefore an object of the present invention to provide a power supply for a plasma chamber which overcomes the drawbacks of the prior art and provides bipolar power to the plasma chamber.

It is a further object of the present invention to provide such a power supply which may be operated at low frequencies.

It is still a further object of the present invention to provide such a power supply which is inexpensive and safe to operate.

These and other related objects are achieved according to the invention by a bipolar power supply having a DC power supply with positive and negative output terminals connected to the input terminals of a MOSFET bridge circuit. The bridge output terminals are connected to a power detection circuit for controlling the MOSFETs, and to the input terminals of the plasma device.

Surprisingly, it was found that the circuit arrangement according to the invention allows a relatively costly HF power supply of about 13.65 Mhz to be replaced by a bipolar pulse current supply of 0 to 50 KHz. The significant advantage of using a bipolar pulse current supply lies mainly in the superior control of the electron and ion flow in plasma-technology applications. The circuit according to the invention provides a simple, controllable alternating electric field.

The invention includes at least four MOSFET's each with module drivers interconnected in a bridge circuit. The inputs of the bridge circuit are connected to positive and negative output terminals of an adjustable DC power supply. The output terminals of the bridge circuit are connected to current detection means or a current detector having a shunt and two current detection and current evaluation units coupled to the shunt tap. The current detection and evaluation units have a bipolar Imax-comparator, and a monitoring unit for monitoring the maximum and the mean current, the temperature, and an auxiliary voltage. The monitoring unit further includes a time arrester, a reset and an indication amplifier. The monitoring unit is connected to a microprocessor unit, which is connected to the module drivers of the MOSFETs via an interface. The interface includes a control signal processor having a Schmitt trigger, frequency limitor, transmission driver and time arrester. The output terminals of the bridge circuit are connected to the plasma device.

BRIEF DESCRIPTION OF THE DRAWINGS

Other objects and features of the present invention will become apparent from the following detailed description considered in connection with the accompanying drawings which disclose two embodiments of the present invention. It should be understood, however, that the drawings are designed for the purpose of illustration only and not as a definition of the limits of the invention.

In the drawings, wherein similar reference characters denote similar elements throughout the several views:

FIG. 6 is a block diagram of an alternate embodiment of the invention with the MOSFETs connected in series;

DETAILED DESCRIPTION OF PREFERRED EMBODIMENTS

Figure 1:
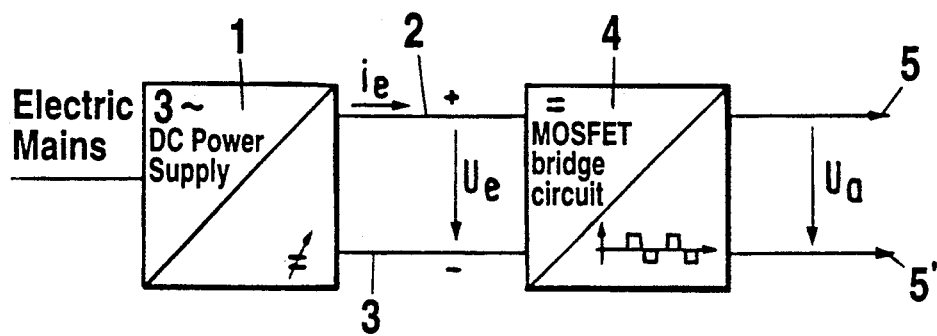
FIG. 1 is a simplified block diagram of the power supply according to the present invention.

Referring now in detail to the drawings and in particular FIG. 1, there is shown a power supply for a plasma chamber according to the invention having a DC power supply 1, with a positive output 2 and a negative output 3 connected to the input terminals of a MOSFET bridge circuit 4. Output terminals 5 and 5' of MOSFET bridge 4 are connected to a plasma chamber.

Figure 2:
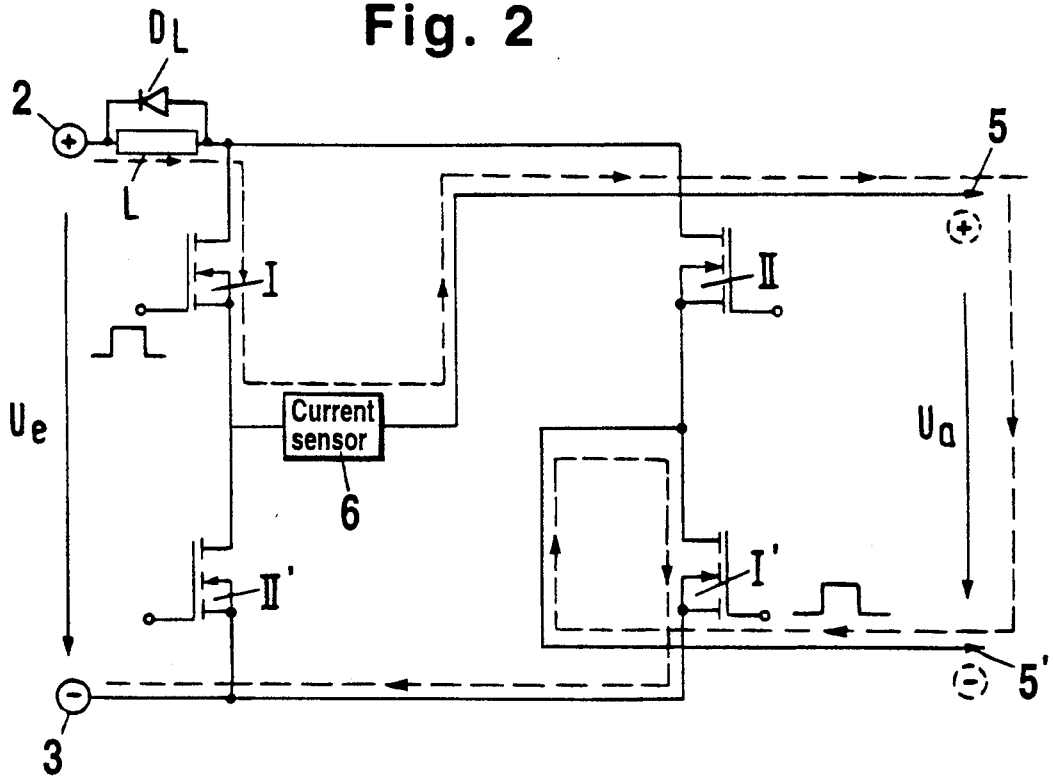
FIG. 2 is a schematic diagram showing the bridge configuration of the MOSFETs from block 4 in FIG. 1.
Figure 4:
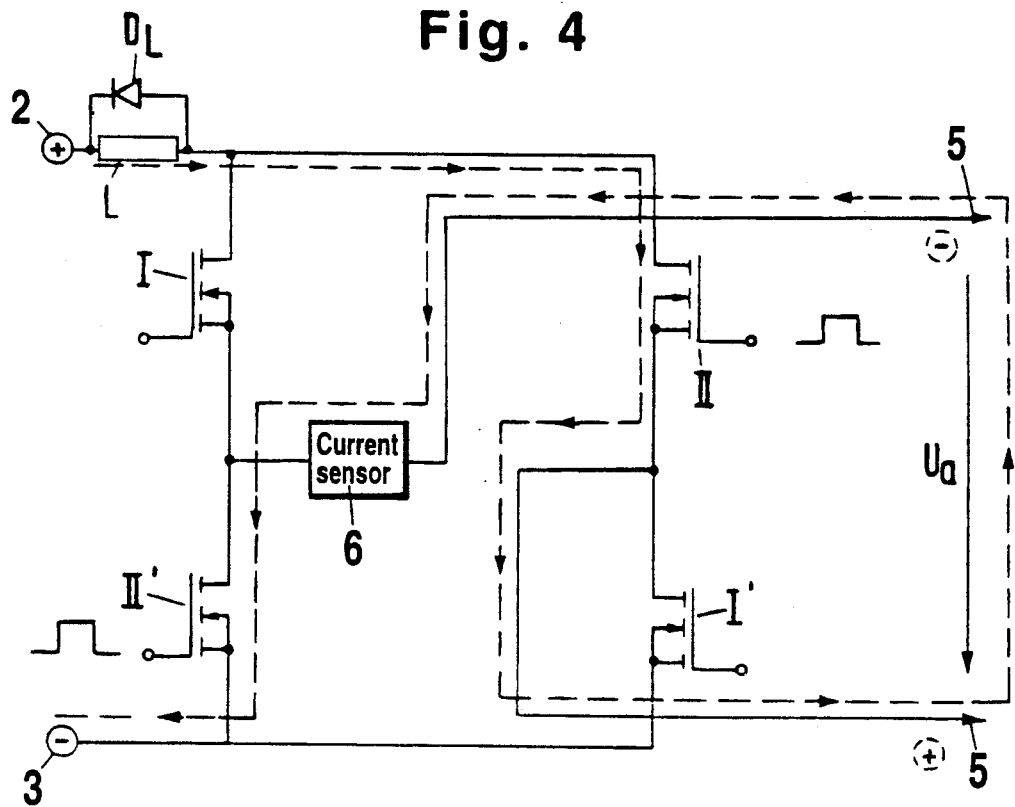
FIG. 4 is a schematic diagram showing the bridge configuration of FIG. 2 with an alternate current path.

FIGS. 2 and 4 show that MOSFET bridge 4 consists of four MOSFETs I, I', II and II'. MOSFETs I and I' form one path (shown in FIG. 2) while II and II' form a second path (shown in FIG. 4). DC power supply 1 is connected to MOSFET bridge 4 so that a controllable and adjustable voltage Ue is fed to bridge 4. Output 5 of MOSFET bridge 4 is connected to a current monitor 6.

Figure 3:
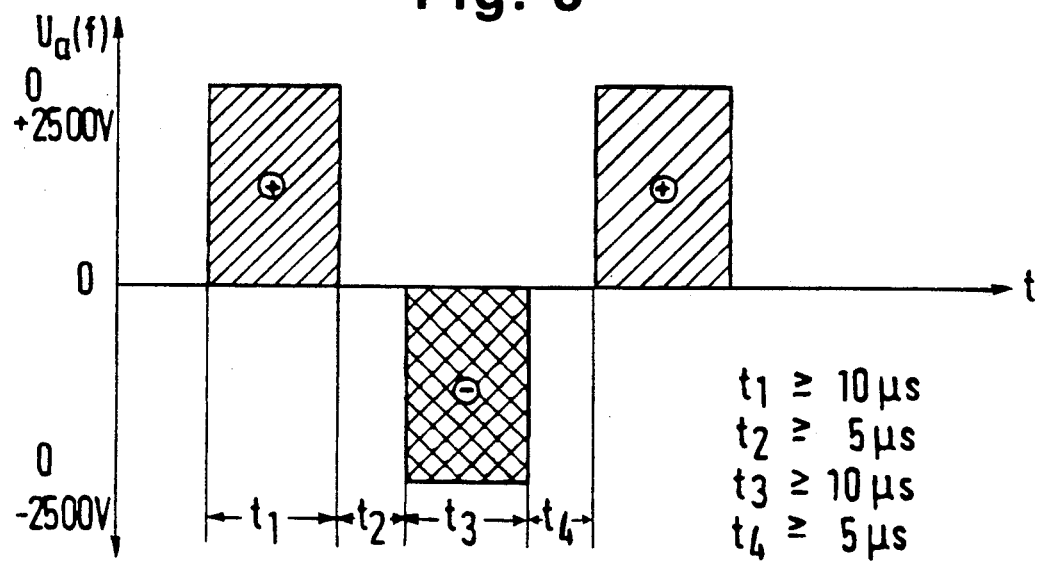
FIG. 3 is a graph showing the output of the power supply with respect to time.

Any desired bipolar pulse can be generated at outputs 5, 5' by controlling the control electrodes of MOSFET's I, I', II and II' accordingly. As shown in FIG. 2, when the path formed by MOSFETs I and I' is active, the diagonal path formed by MOSFETs II and II' is inactive producing a positive current flow from output 5 to output 5'. This is shown in FIG. 3 by the single cross-hatched areas having a $\oplus$ above the t axis.

FIG. 4 shows the path formed when MOSEFT's II and II' are active, so that the current flow is reversed, i.e., a positive current flows from output 5' to output 5 or a negative current flows from output 5 to output 5'. This is shown in FIG. 3 by the double cross-hatched areas having a $\ominus$ below the t axis. The inductor L (FIGS. 2, 4, 5) protects whichever MOSFET branch is active against any excessive current increase with diode DL operating as freewheeling diode. The pulse pattern Ua (t) with the shortest frequency is shown in FIG. 3. For reversing the current flow, a resting time of at least 5 μsec is required. The times $t_1$ to $t_4$ are freely adjustable upwardly. Furthermore, it is possible to selectively operate the upper, positive voltage time area, or the lower, negative voltage time area, whereby only one diagonal branch I, I' or II, II' will be active for a given application.

Output pulses are possible up to voltage levels of 2500 volts, and a pulse power output of 10 kW. Voltage levels of up to 1200 volts, however, are possible up to a pulse power output of 150 kW. The upper frequency limit is 50 KHz.

During normal operations voltage arcs or short circuits occur within the plasma. Current monitor 6 detects the actual current and the inductor L limits any current increase. The total current di/dt is evaluated for protecting the MOSFET's. In case of excessive current, the branch active at that time is switched off by current monitor 6. After the short-circuit current has decreased toward zero, the operation is continued but only after the current has almost reached zero amperes.

Figure 5A:
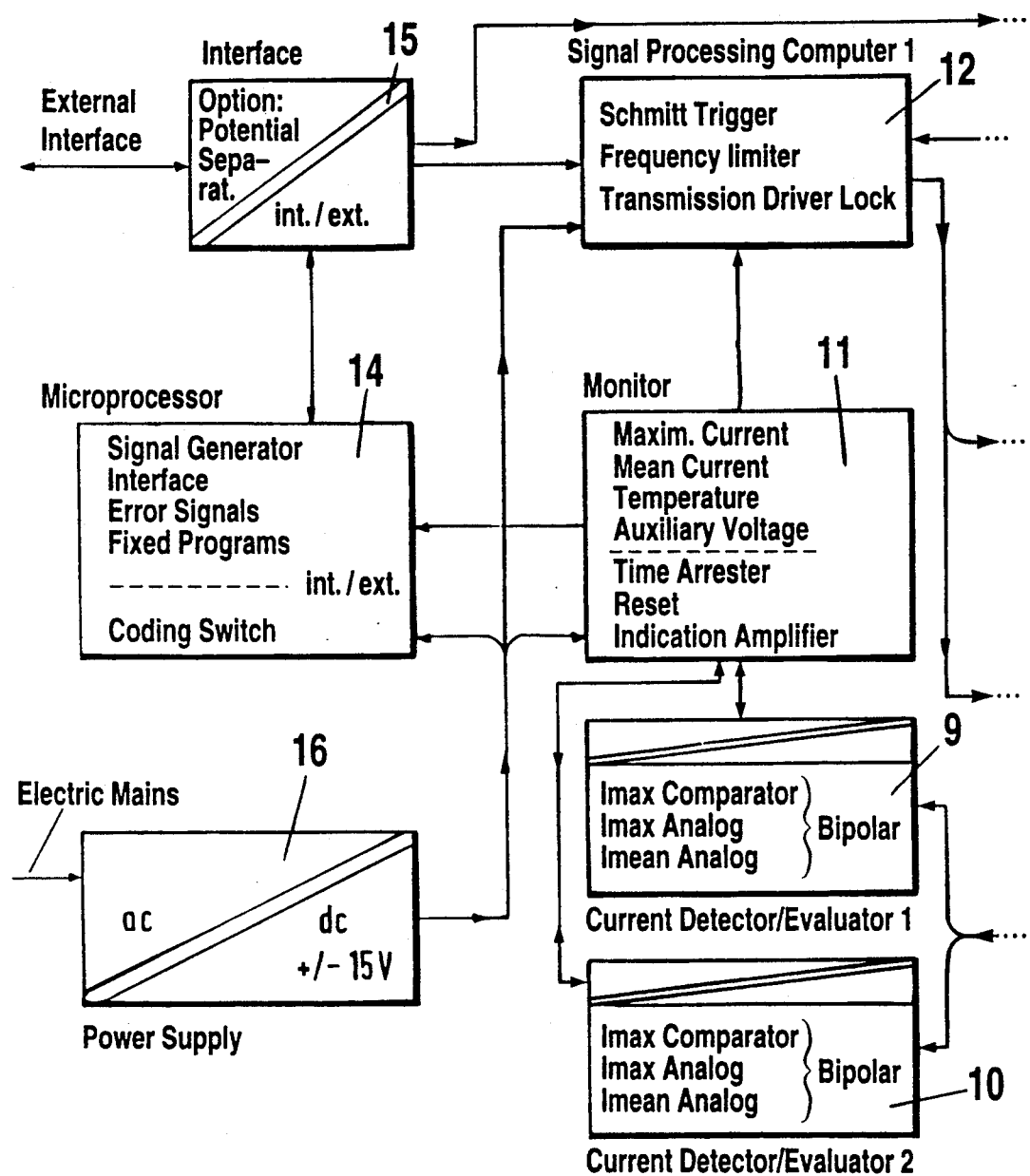
FIGS. 5a and 5b are a detailed block diagram of the power supply according to the invention.
Figure 5B:
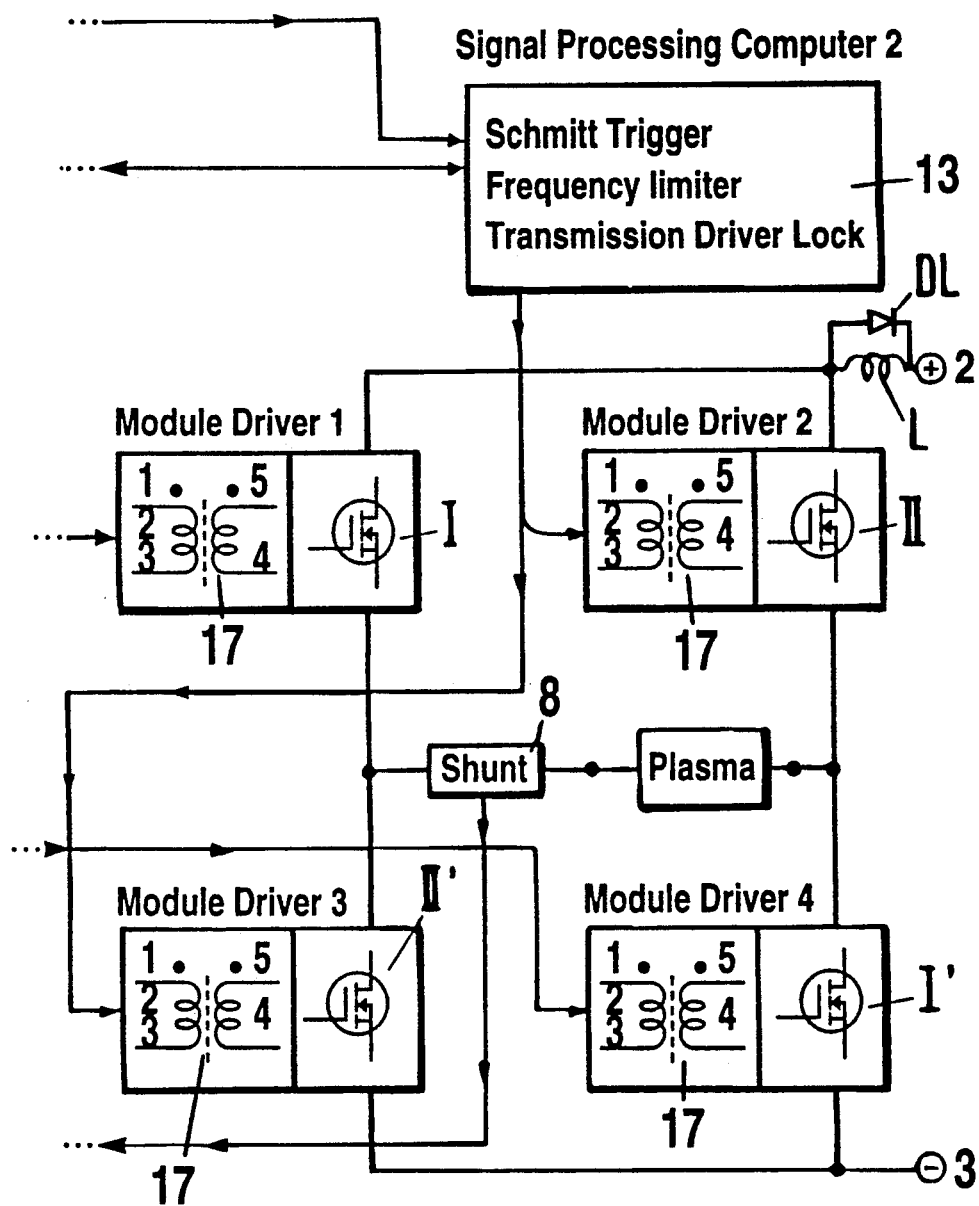

A detailed block diagram of the circuit is shown in FIGS. 5a and 5b. The MOSFETs I, I' and II, II' are connected in a bridge circuit with outputs 5 and 5' coupled to the plasma chamber. The current detection system consists of a shunt 8, having a tap connected to two current detection and current evaluation components 9 and 10, each of which has an Imax-comparator, an Imax analog evaluator and an Imean analog evaluator for bipolar operation.

The outputs of components 9 and 10 are connected to a monitoring component 11, which monitors the maximum current, the mean current, the temperature and an auxiliary voltage. Monitor 11 is provided with a time arrester, a reset and an indication amplifier. Monitor 11 is connected to a first control signal processing component 12 and to a second control signal processing component 13. Signal processing components 12 and 13 are controlled by a microprocessor 14 and an interface 15. Signal processing components 12 and 13 each contain a Schmitt trigger, a frequency limiter, a transmission driver and a lock. The power for the electronic components is provided by a power supply 16. Components 12 and 13 supply control signals to the individual MOSFETs I, I' and II, II' via special module drivers 17. The desired bipolar pulse current is then generated according to the programming of microprocessor 14.

FIG. 6 shows an alternate embodiment of the circuit arrangement of FIGS. 5a and 5b. In this case, however, up to n MOSFETs each with a driver circuit 17 can be utilized in the bridge. The series connection of MOSFETs can be used to produce voltages of up to 2500 volts.

The bipolar pulse current supply according to the invention offers a number of advantages over the prior art. The plasmas produced at high frequency are locally linked to a characteristic reflection curve. Bipolar pulse plasmas may form a complete space plasma within a chamber, i.e. the potential between the casing and the substrate, and thus completely enclose materials having any type of geometry. Furthermore, bipolar pulse plasmas can be currently structured with high energy pulse power outputs of up to 150 kW. These high power plasmas can be used even in large industrial plants.

Furthermore, plasmas produced with dc voltage or unipolar pulses do not provide the advantages of a bipolar pulse source (i.e. coating of semiconductors and nonconductors).

High frequency plasmas at 13.65 MHz and the high energy equipment needed to produce them are costly. They further have involved safety requirements for their operators. With the bipolar pulse sources, the plasmas are generated in the 0 to 50 KHz range, which means the equipment costs are significantly reduced and the safety requirements are lower.

Figure 7:
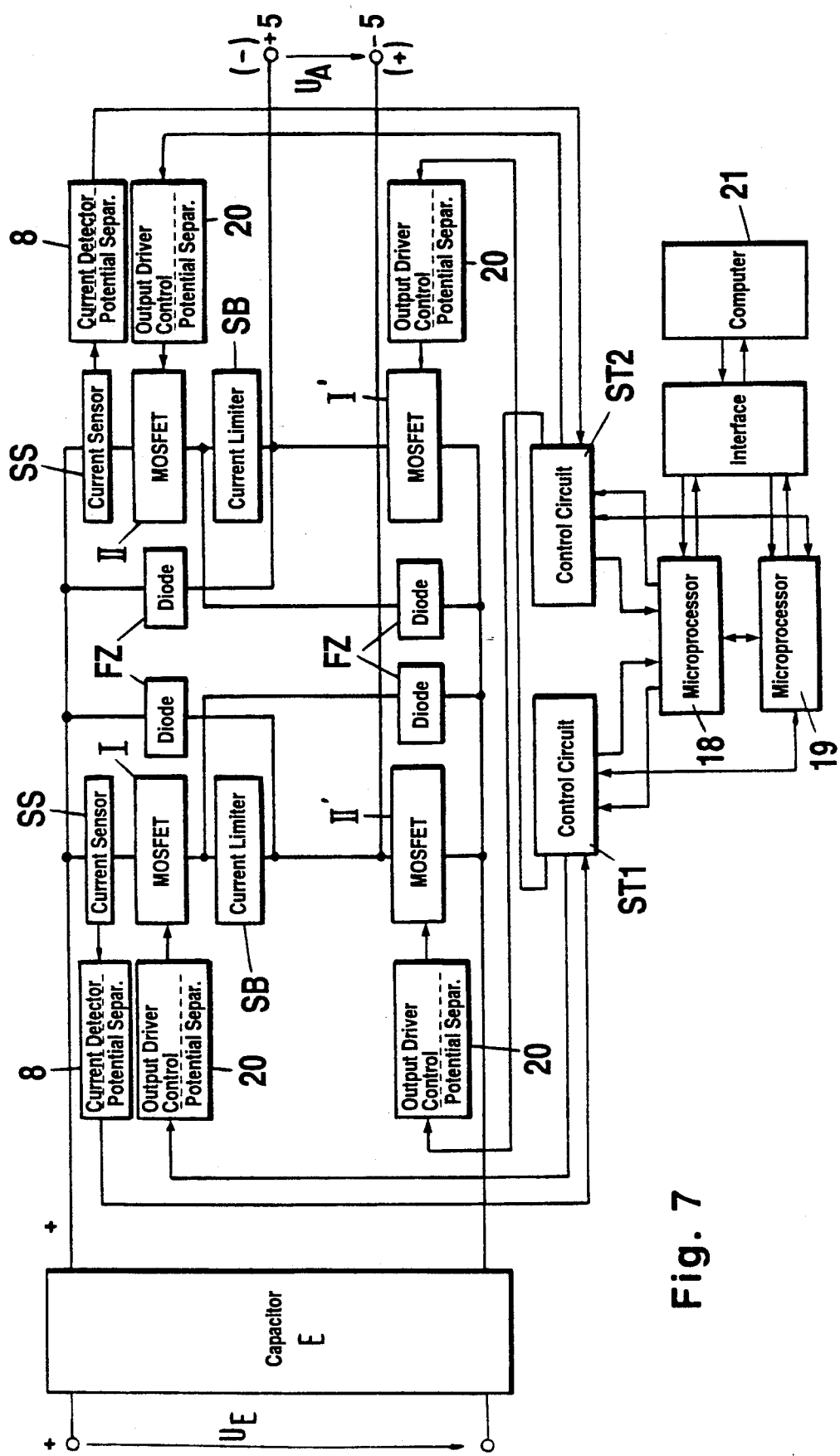
FIG. 7 is a block diagram of a different embodiment of the invention.

The circuit arrangement according to FIG. 7 shows another variation of the circuit arrangement of FIG. 5a and 5b. In the present case, all available electronic components (i.e. Metal-oxide-semiconductor field effect transistor - MOSFET bipolar transistors, isolated gate bipolar transistors - IGBT's, etc.) can be used in the bridge as the electronic power switches I, I', II, II'. This applies to the circuit arrangement according to FIGS. 5a and 5b as well. For generating pulses, a capacitor ES is connected across positive output 2 and negative output 3 and contributes to the pulse characteristics.

The rate of the current increase is no longer limited by the inductor L (as in FIGS. 5a and 5b) at positive output 2 of the DC power supply, but by a current limiter SB. There is one current limiter in each of two branches which includes one inductor SB and two diodes FZ. The current is detected by the current sensors SS in the respective branches, and can be separately adjusted with respect to a response threshold value. Two special control circuits ST1, ST2 receive signals from current detectors 9 and 10, and are actuated by a microprocessor control 18 and an analog OP amplifier 19. Control circuits ST1 and ST2 control power drivers 20 for the electronic power switches I, I', II, II'. Microprocessor control 18 and analog OP amplifier 19 each are connected to a process computer 21 via an interface. With the varied circuit arrangement, control and regulation of the plasma intensity are dependent upon the power input, the location, and the timing of the bipolar pulse current supply.

By virtue of the free adjustability and selectivity of the bipolar power supply dc+, dc−, unipolar+ and unipolar−, control functions are possible. This would allow a plasma treatment of materials such as conductors, semiconductors and non-conductors.

Figure 8:
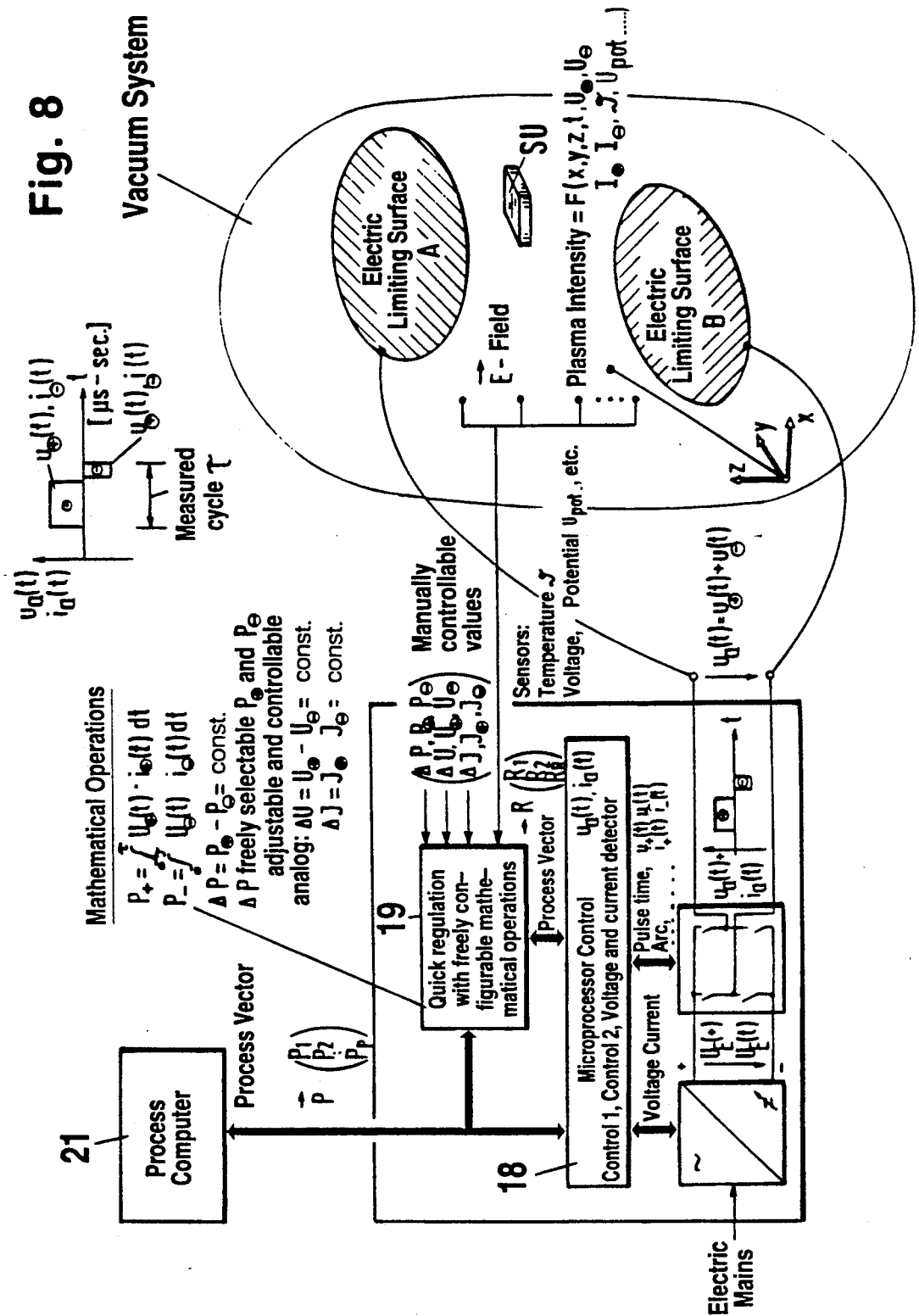
FIG. 8 is an overview of a system for controlling a vacuum plasma chamber.

FIG. 8 shows how the plasma intensity is controlled as a function of location XYZ and time t as well as power input to the electrically conductive surfaces A and B. The substrate can be formed by the limiting surfaces A or B. With semi- and non-conductive substrates, the substrate can be present outside the limiting surfaces A, B in a freely selectable location within the plasma system, as shown by SU in FIG. 8. A or B could also represent the chamber wall of the vacuum system itself, or parts of the vacuum system.

Commands and messages are transmitted via the process computer 18 with the process vector P (p1 . . . Pp) of the control unit ST1, ST2. The plasma is controlled and regulated by the control vector R (R1. . . Rr) with the bipolar pulse unit acting as the adjusting member. This permits quick controlling with any configurable mathematical operations. For highly sensitive and highly exact plasma processes, and mainly for those which tend to be unstable (arc), it may be necessary to optionally use high-speed control with any configurable mathematical operations, as shown in FIG. 8. The electrical quantities ua (t)=u ⊕ (t)+u ⊖ (t), and ia (t)=i ⊕

(t)+i ⊖ (t), where ⊕ is a positive pulse and ⊕ is a negative pulse, serve as actual values.

The following 9 quantities can be determined based on the electrical quantities within one measuring cycle $\tau$ ($\tau$ extend over any number of measuring periods) via known analog operation amplifier circuits (adders, subtracters, integrators, differentiators, PI=PID controllers, etc.):

(1) Voltage $$U_\oplus = \int_0^\tau U_\oplus(t)\, dt$$

$$U_\ominus = \int_0^\tau U_\ominus(t)\, dt$$

$\Delta U = U_\oplus - U_\ominus = \text{const.}$
$\Delta U$ adjustable/controllable arbitrarily between $U_\oplus$ and $U_\ominus$ (2) Current $$I_\oplus = \int_0^\tau i_\oplus(t)\, dt$$

$$I_\ominus = \int_0^\tau i_\ominus(t)\, dt$$

$\Delta I = i_\oplus - i_\ominus = \text{const.}$
$\Delta I$ adjustable/controllable arbitrarily between $I_\oplus$ and $I_\ominus$ (3) Output $$P_\oplus = \int_0^\tau U_\oplus(t) \cdot i_\oplus(t)\, dt$$

$$P_\ominus = \int_0^\tau U_\ominus(t) \cdot i_\ominus(t)\, dt$$

$\Delta P = P_\oplus - P_\ominus = \text{const.}$
$\Delta P$ adjustable/controllable arbitrarily between $P_\oplus$ and $P_\ominus$ The adjustments for the (1) voltage, (2) current, and (3) power are fully automatic via the process vector P, or via a manual adjustment. A selection of the (1) voltage, (2) current, and (3) power can be made depending on the plasmatechnology application such as, for example:

Etching (cleaning);
Hardening;
Coating;
Implanting;
Heating (without hardening);
Sputtering; etc.

Directly controlling the plasma via the electrical quantities $u_a(t)$, $i_a(t)$, $P_a(t)$ is possible with the present arrangement with very high precision by directly influencing the pulse time areas ⊕ and ⊖ in the μsec to second range. The plasma intensity function (x, y, z, t, $u_\oplus$, $u_\ominus$, $i_\oplus$, $i_\ominus$, $\theta$, $U_{Pot}$ ...), which, for example, is controlled by the process computer, can be called upon for treating the substrate or for treating highly complex processes. A suitable sensorics, for example, a temperature distribution ($\theta$) or a voltage potential distribution ($U_{Pot}$) can be jointly used as a superimposed control. This indicated by reference numeral 22 is FIG. 8.

A high-speed electric pulse measurement $u_a(t)$, $i_a(t)$, $P_a(t)$ with a suitable control can serve for optimally controlling the flow of electrons and ions for a plasma process. Hollow-cathode effects can be eliminated, for example, with the bipolar technique by separately controlling/regulating the positive and negative pulse portions. The sensitivity to arcing with high-speed transitions from the glow discharge to the arc discharge can be reduced or prevented.

The device according to the invention is applicable for plasma-based processes, such as, for example:
PVD technology (PVD—physical vapor deposition)
CVD technology (CVD—chemical vapor deposition)
plasma-CVD;
plasma nitrating;
cathode atomizing;
surface cleaning (etching by means of plasma);
plasma-technology treatment (coating, cleaning);
ion implantation.

While several embodiments of the present invention have been shown and described, it is to be understood that many changes and modifications may be made thereunto without departing from the spirit and scope of the invention as defined in the appended claims.

What is claimed is:

1. A bipolar power supply for a plasma chamber comprising:
   an adjustable DC power supply having a positive output terminal and a negative output terminal;
   a semiconductor bridge circuit having two bridge input terminals coupled to said positive and negative output terminals and two bridge output terminals coupled to the plasma chamber; and
   current detection means coupled to said two bridge output terminals for detecting the current flowing to the plasma chamber and controlling said semiconductor bridge circuit to provide a bipolar power supply to the plasma chamber; wherein said current detection means comprises:
   (a) a shunt having a tap coupled to said two bridge output terminals;
   (b) two current detection and evaluation circuits coupled to said tap of said shunt and having a bipolar maximum current comparator;
   (c) monitoring means coupled to said two current detection and evaluation circuits for monitoring the maximum current, the mean current, the temperature, an auxiliary voltage, and having a timer, a reset and an indication amplifier;
   (d) a microprocessor coupled to said monitoring means; and
   (e) an interface, and two control signal processing units coupled to said microprocessor, said two control signal processing units each having a Schmitt trigger, a frequency limiter, a transmitter driver, and transmitter arrestor;
   whereas said semiconductor bridge circuit includes four transistors each with a module driver, two of said transistors forming a first branch of said bridge circuit and having their module drivers coupled to one of said two control signal processing units, the other two of said transistors forming a second branch of said bridge circuit and having their module drivers coupled to the other of said two control signal processing units; and
   whereas said microprocessor receives signals from said two current detection and evaluation circuits and said monitoring means and through said interface instructs said two control signal processing units to switch said first and second branches of said semiconductor bridge circuit on and off to control and regulate the plasma intensity.

2. A bipolar power supply for a plasma chamber comprising:

an adjustable DC power supply having a positive output terminal and a negative output terminal;

a semiconductor bridge circuit having two bridge input terminals coupled to said positive and negative output terminals and two bridge output terminals coupled to the plasma chamber, said conductor bridge circuit including four transistors, two of said transistors forming a first branch of said bridge circuit and the other two of said transistors forming a second branch of said bridge circuit;

current detection means coupled to said two bridge output terminals for detecting the current flowing to the plasma chamber and controlling said semiconductor bridge circuit to provide a bipolar power supply to the plasma chamber, said current detection means comprising:

(a) an inductor and two free-wheeling diodes coupled to each branch for limiting the total current flowing through said branch;

(b) two independently adjustable current sensors, each coupled to one of said branches;

(c) two current detectors, each coupled to one of said current sensors;

(d) two control circuits, each coupled to one of said current detectors;

(e) an operational amplifier and a microprocessor coupled to said two control circuits;

(f) an interface and a process computer coupled to said operational amplifier and said microprocessor; and (g) four output driver controls, two of said four output driver controls coupled to one of said control circuits and coupled to two transistors of one branch, and the other two of said four output driver controls coupled to the other of said control circuits and coupled to the other two transistors of the other branch; and whereas said process computer receives signals from said two current sensors and said two current detectors and through said interface, said operational amplifier, said microprocessor and said two control circuits instructs said four output driver controls to switch said four transistors on and off to control and regulate the plasma intensity.

3. The bipolar power supply according to claim 2, whereas said four transistors are selected from the group consisting of MOSFETs, bipolar transistors, insulated gate bipolar transistors and high speed electric current semiconductors.

4. The bipolar power supply according to claim 3, additionally including a capacitor having two terminals, one of said terminals being coupled to the positive output terminal and the other of said terminals being coupled to the negative output terminal of said adjustable DC power supply.

5. The bipolar power supply according to claim 4, wherein the power supply to the plasma chamber has a frequency of up to 50 KHz.

6. The bipolar power supply according to claim 5, wherein the power supply to the plasma chamber has a voltage output up to 1200 volts and a power output of up to 150 kW.

7. A bipolar power supply for a plasma chamber comprising:

an adjustable DC power supply;

a plurality of MOSFETs, each having a driver, said plurality of MOSFETs coupled between said adjustable DC power supply and the plasma chamber;

current detection means coupled to at least one of said plurality of MOSFETs for detecting the current flowing to the plasma chamber and controlling said plurality of MOSFETs through said drivers; wherein said current detection means comprises:

(a) a shunt having a tap coupled to the plasma chamber;

(b) a current detection circuit coupled to said tap of said shunt and having a bipolar maximum current comparator;

(c) monitoring means coupled to said current detection circuit for monitoring the maximum current, the mean current, the temperature, and auxiliary voltage, and having a timer, a reset and an indication amplifier;

(d) a microprocessor coupled to said monitoring means; and (e) an interface and a signal processing computer coupled to said microprocessor and said drivers, said signal processing computer having a Schmitt trigger, a frequency limiter and a transmission driver;

whereas said microprocessor receives signals from said current detection circuit and said monitoring means and through said interface instructs said signal processing computer to switch said plurality of MOSFETs on and off to control and regulate the plasma intensity.

8. The bipolar power supply according to claim 7, wherein the power supply has a voltage output up to 2500 volts and a power output of up to 10 kW.

* * * * *